(12) United States Patent
Shu et al.

(10) Patent No.: US 11,265,010 B2
(45) Date of Patent: Mar. 1, 2022

(54) INCREMENTAL ANALOG-TO-DIGITAL CONVERTER

(71) Applicant: MEDIATEK INC., Hsinchu (TW)

(72) Inventors: Yun-Shiang Shu, Hsinchu (TW); Su-Hao Wu, Hsinchu (TW); Hung-Yi Hsieh, Hsinchu (TW); Albert Yen-Chih Chiou, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/837,417

(22) Filed: Apr. 1, 2020

(65) Prior Publication Data
US 2020/0343905 A1 Oct. 29, 2020

Related U.S. Application Data

(60) Provisional application No. 62/839,820, filed on Apr. 29, 2019.

(51) Int. Cl.
*H03M 3/00* (2006.01)
(52) U.S. Cl.
CPC ........... *H03M 3/422* (2013.01); *H03M 3/464* (2013.01)
(58) Field of Classification Search
CPC .......... H03M 3/43; H03M 3/424; H03M 3/39; H03M 3/452; H03M 3/438; H03M 3/454; H03M 3/3287; H03M 3/332; H03M 3/364; H03M 3/366; H03M 3/376; H03M 3/458; H03M 1/00; H03M 1/001; H03M 1/12; H03M 3/30
USPC ......................... 341/118, 120, 139, 140, 143
See application file for complete search history.

(56) References Cited

U.S. PATENT DOCUMENTS

| | | | |
|---|---|---|---|
| 6,906,565 B2* | 6/2005 | Keaveney | H03K 3/0231 327/147 |
| 7,365,667 B1* | 4/2008 | Nanda | H03M 3/32 341/143 |
| 7,525,465 B1* | 4/2009 | Elwan | H03M 3/364 341/120 |
| 8,698,664 B2 | 4/2014 | Oliaei et al. | |
| 9,432,049 B2 | 8/2016 | Katayama et al. | |
| 9,831,885 B2 | 11/2017 | Shu | |
| 9,866,238 B1* | 1/2018 | Thomsen | H03M 3/422 |
| 2007/0035429 A1* | 2/2007 | Schreier | H03M 3/376 341/143 |

(Continued)

FOREIGN PATENT DOCUMENTS

| WO | 2013/077873 A1 | 5/2013 |
|---|---|---|
| WO | 2015/200267 A1 | 12/2015 |

OTHER PUBLICATIONS

"An adaptive continuous-time incremental ΣΔADC for neural recording implants" by Barati and Yavari Pub. on Apr. 16, 2018 (Year: 2018).*

(Continued)

*Primary Examiner* — Linh V Nguyen
(74) *Attorney, Agent, or Firm* — McClure, Qualey & Rodack, LLP

(57) ABSTRACT

An incremental analog-to-digital converter (ADC) with high accuracy. The incremental ADC has a delta-sigma modulator, performing delta-sigma modulation on an analog input signal to output a quantized signal, and a digital filter, receiving the quantized signal to generate a digital representation of the analog input signal. A loop filter of the delta-sigma modulator has a preset circuit. In the preset circuit, the output terminal of the loop filter is preset rather than being reset during the reset phase of the incremental ADC.

15 Claims, 5 Drawing Sheets

(56) References Cited

U.S. PATENT DOCUMENTS

| | | | | |
|---|---|---|---|---|
| 2009/0278719 | A1* | 11/2009 | Braswell | H03M 3/366 |
| | | | | 341/143 |
| 2011/0260900 | A1* | 10/2011 | Vanderhaegen | H03M 3/338 |
| | | | | 341/155 |
| 2012/0112797 | A1* | 5/2012 | Ezekwe | G01R 19/2509 |
| | | | | 327/103 |
| 2016/0173120 | A1* | 6/2016 | Doare | H03M 3/378 |
| | | | | 341/120 |
| 2016/0197619 | A1* | 7/2016 | Katayama | H03M 1/12 |
| | | | | 341/143 |
| 2016/0380646 | A1* | 12/2016 | Kauffman | H03M 3/464 |
| | | | | 341/118 |
| 2018/0269896 | A1* | 9/2018 | Ouzounov | H03M 3/496 |

OTHER PUBLICATIONS

European Search Report dated Oct. 6, 2020, issued in application No. EP 20169832.1.

Chinese language office action dated Dec. 2, 2020, issued in application No. TW 109111906.

Shui, B., et al.; "A 70.8 dB 0.0045 mm 2 Low-power Continuous-Time Incremental Delta-Sigma Modulator for Multi-Site Neural Recording Interfaces;" IEEE; May 2018; pp. 1-4.

Markus, J., et al.; "Theory and Applications of Incremental ΔΣConverters;" IEEE Transactions on Circuits and Systems-I; Regular Papers; vol. 51; No. 4; Apr. 2004; pp. 678-690.

Temes, G.C., et al.; "Incremental Analog-To Digital Converters;" Understanding Delta Sigma Data Converters, Second Edition; Jan. 2017; pp. 407-423.

* cited by examiner

INCREMENTAL ANALOG-TO-DIGITAL CONVERTER

CROSS REFERENCE TO RELATED APPLICATIONS

This application claims the benefit of U.S. Provisional Application No. 62/839,820, filed on Apr. 29, 2019, the entirety of which is incorporated by reference herein.

BACKGROUND OF THE INVENTION

Field of the Invention

The present invention relates to incremental analog-to-digital converters (ADCs).

Description of the Related Art

Delta-sigma analog-to-digital converters ($\Delta\Sigma$ ADCs) are used in many applications because of the reduced cost and circuit complexity. Wireless communication systems (e.g., telecommunication systems, television, radio and other media systems, data communication networks, and other systems to convey information between remote points using wireless transmitters and wireless receivers) usually use delta-sigma ADCs.

A delta-sigma ADC includes a delta-sigma modulator and a digital filter. An analog input signal (Ain) is processed by the delta-sigma modulators, and the output of the delta-sigma modulator is a quantized signal which is digitally integrated by the digital filter to generate a digital representation (Dout) of the analog input signal (Ain). In the delta-sigma modulator, a rough estimate of the analog input signal (Ain) is fed back and subtracted from the analog input signal (Ain), and the difference is integrated to compensate for the difference. A delta-sigma ADC may be referred to as an nth-order delta-sigma ADC, wherein n equals the number of cascaded analog integrators within the delta-sigma modulator. The number of order of digital integral provided by the digital filter is preferably the same as the number of analog integrators cascaded in the delta-sigma modulator.

A particular type of delta-sigma ADC is known as an incremental ADC, wherein the analog and digital integrators within the ADC are reset after each analog-to-digital conversion cycle, ready for the next analog-to-digital conversion cycle.

However, the reset procedure on the analog integrators may induce a non-linear problem which considerably affects the accuracy of the incremental ADC.

BRIEF SUMMARY OF THE INVENTION

An incremental analog-to-digital converter (ADC) with high accuracy is introduced in the present invention.

An incremental ADC in accordance with an exemplary embodiment includes a delta-sigma modulator and a digital filter. The delta-sigma modulator performs delta-sigma modulation on an analog input signal to output a quantized signal. The digital filter receives the quantized signal to generate a digital representation of the analog input signal. The delta-sigma modulator includes a quantizer, a digital-to-analog converter, and a loop filter. The quantizer outputs the quantized signal. The digital-to-analog converter is coupled to an output terminal of the quantizer and generates an estimate of the quantized signal. The loop filter operates according to the difference between the analog input signal and the estimate, and the output terminal of the loop filter is coupled to the input terminal of the quantizer. The loop filter has a preset circuit that presets the output terminal of the loop filter during the reset phase of the incremental analog-to-digital converter.

In an exemplary embodiment, the loop filter comprises a plurality of analog integrators cascaded in a series. The preset circuit includes a plurality of preset elements corresponding to the plurality of analog integrators one by one. Each preset element and a feedback capacitor of the corresponding analog integrator are connected in parallel during the reset phase of the incremental analog-to-digital converter.

In an exemplary embodiment, the loop filter comprises a first analog integrator. The first analog integrator has a first operational amplifier and a first feedback capacitor coupled between an input terminal and an output terminal of the first operational amplifier. The preset circuit comprises a first switch and a first preset element connected in series between the input terminal and the output terminal of the first operational amplifier. The first switch is closed during the reset phase of the incremental analog-to-digital converter. In an exemplary embodiment, the loop filter further comprises a second analog integrator coupled between the first analog integrator and the quantizer. The second analog integrator has a second operational amplifier and a second feedback capacitor coupled between the input terminal and the output terminal of the second operational amplifier. The preset circuit further comprises a second switch and a second preset element connected in series between the input terminal and the output terminal of the second operational amplifier. The second switch is closed during the reset phase of the incremental analog-to-digital converter. In an exemplary embodiment, the second analog integrator comprises an input resistor coupled between the output terminal of the first operational amplifier and the input terminal of the second operational amplifier. The preset circuit further comprises a third switch and a third preset element connected in series between the output terminal of the first operational amplifier and the input terminal of the second operational amplifier. The third switch is closed during the reset phase of the incremental analog-to-digital converter.

In an exemplary embodiment, the loop filter comprises a plurality of analog integrators cascaded in a series. The preset circuit couples the analog input signal to output terminals of the analog integrators during the reset phase of the incremental analog-to-digital converter. In an exemplary embodiment, the analog integrators are reset during the reset phase of the incremental analog-to-digital converter.

In an exemplary embodiment, the loop filter comprises a first analog integrator. The preset circuit comprises a first switch and a first preset element connected in series. The first switch is closed during the reset phase of the incremental analog-to-digital converter. The analog input signal is coupled to an output terminal of the first analog integrator by the first preset element when the first switch is closed. In an exemplary embodiment, the loop filter further comprises a second analog integrator coupled between the first analog integrator and the quantizer. The preset circuit comprises a second switch and a second preset element connected in series between the output terminal of the first analog integrator and an output terminal of the second analog integrator. The second switch is closed during the reset phase of the incremental analog-to-digital converter. In an exemplary embodiment, the first and second analog integrators are reset during the reset phase of the incremental analog-to-digital converter.

In an exemplary embodiment, the digital filter comprises a digital integrator that is reset during the reset phase of the incremental analog-to-digital converter. In an exemplary embodiment, the quantizer is reset during the reset phase of the incremental analog-to-digital converter.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
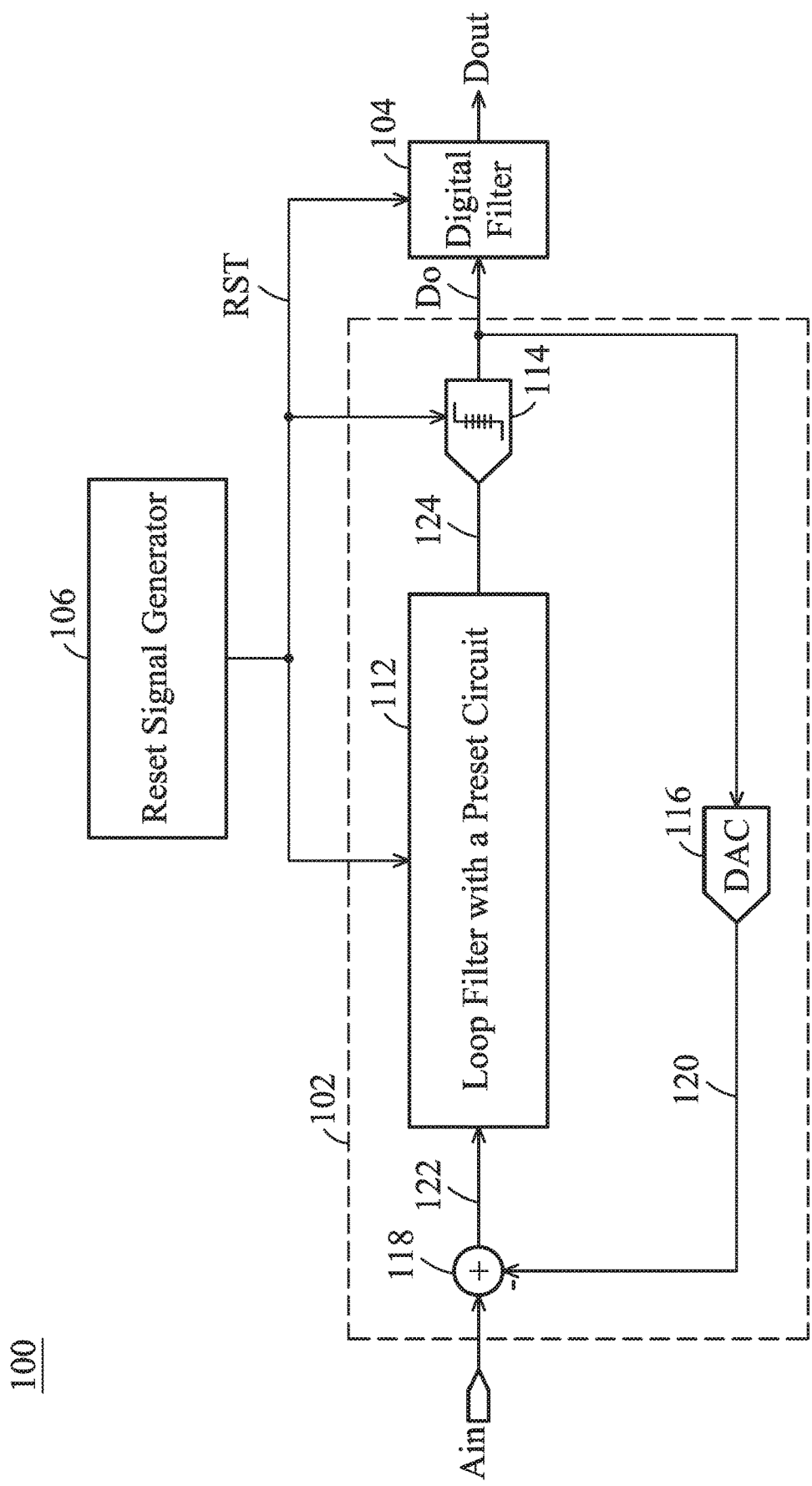
FIG. 1 is a block diagram depicting an incremental analog-to-digital converter (ADC) 100 in accordance with an exemplary embodiment of the present invention.

FIG. 1 is a block diagram depicting an incremental analog-to-digital converter (ADC) 100 in accordance with an exemplary embodiment of the present invention. The incremental ADC 100 includes a delta-sigma modulator 102, a digital filter 104 and a reset signal generator 106. An analog input signal Ain is processed by the delta-sigma modulator 102, and the output of the delta-sigma modulator 102 is a quantized signal Do which is digitally integrated by the digital filter 104 to form a digital representation Dout of the analog input signal Ain.

The delta-sigma modulator 102 includes a loop filter 112 (having L (>=1) analog integrators), a quantizer 114, a digital-to-analog converter (DAC) 116, and an adder 118. The DAC 116 outputs a signal 120 (a rough estimate of the input signal Ain) to be subtracted from the input signal Ain by the adder 118. The difference 122 is processed by the loop filter 112 and then is quantized by the quantizer 114 as the quantized signal Do. Not only being fed to the digital filter 104, the quantized signal Do is also fed back as the input of the DAC 116. In an analog-to-digital conversion cycle, the difference 122 is compensated for, and the integral (calculated by the loop filter 112) of the difference 122 reaches a stable value. The quantized signal Do that is gradually stabilized is digitally integrated by the digital filter 104 to generate a digital representation Dout of the analog input signal Ain.

As shown, the reset signal generator 106 generates a reset signal RST to reset the incremental ADC 100 during a reset phase after each analog-to-digital conversion cycle. According to the reset signal RST, the digital integrators within the digital filter 104 are reset. Specifically, the quantizer 114 is also reset according to the reset signal RST to output a reset value (e.g., Do=0) to the digital filter 104 to completely clean the capacitors of the digital integrators within the digital filter 104. The reset phase makes a one-to-one mapping between the analog input signal Ain and digital representation Dout. To prevent the reset value (e.g., Do=0) from the quantizer 114 from being fed into the next analog-to-digital conversion cycle, a preset circuit is introduced for the output terminal of the loop filter 112. The preset circuit presets the output terminal 124 of the loop filter 112 during the reset phase of the incremental ADC 100. At the beginning of each analog-to-digital conversion cycle, the signal transmitted from output terminal of the loop filter 112 to the quantizer 114 is a preset value (preset during the reset phase) rather than zero. The non-zero preset value is fed back the loop filter 112 through the quantizer 114, the DAC 116 and the adder 118, which effectively limit the difference 122. The analog integrators within the loop filter 112, therefore, all operate within their linear regions. The non-linear errors due to a dramatic variation of the difference 122 at the beginning of each analog-to-digital conversion cycle are reduced.

Figure 2:
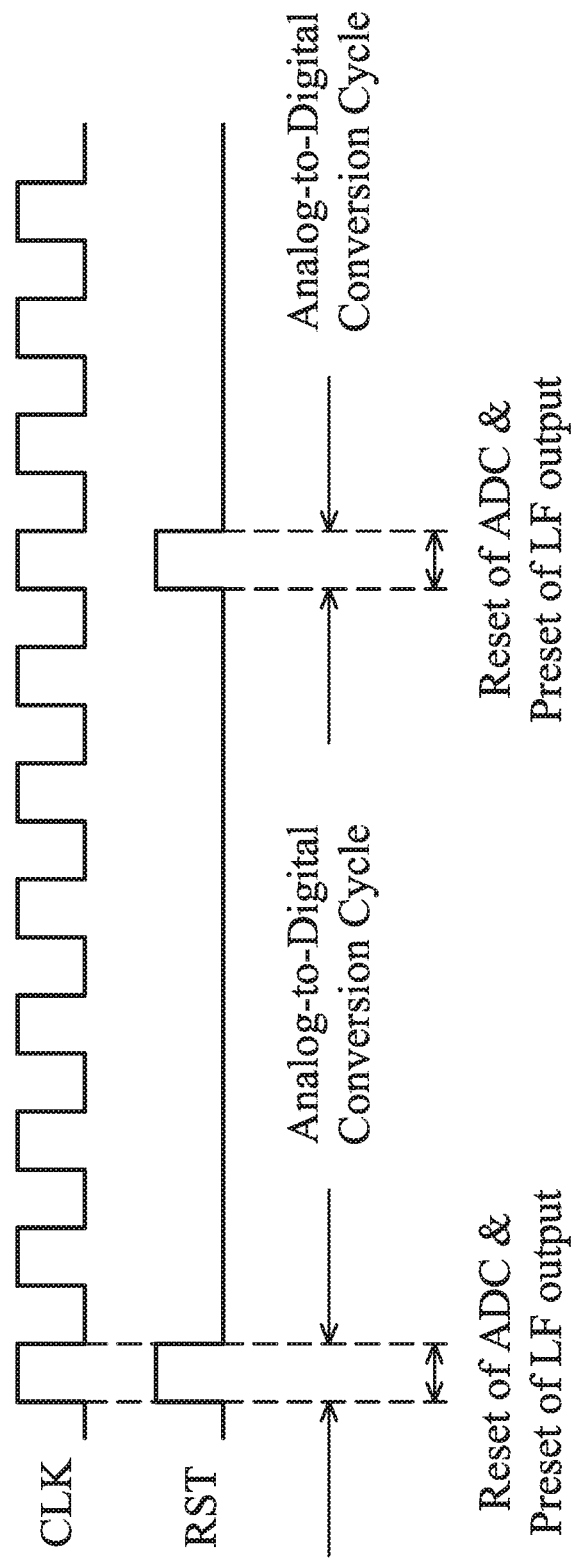
FIG. 2 shows the waveform of the reset signal RST.

FIG. 2 shows the waveform of the reset signal RST. The reset signal generator 106 may generate the reset signal RST according to a clock signal CLK. As shown, between the analog-to-digital conversion cycles, a reset phase is required. During the reset phase of the incremental ADC 100, the output terminal of the loop filter 112 is preset.

Figure 3:
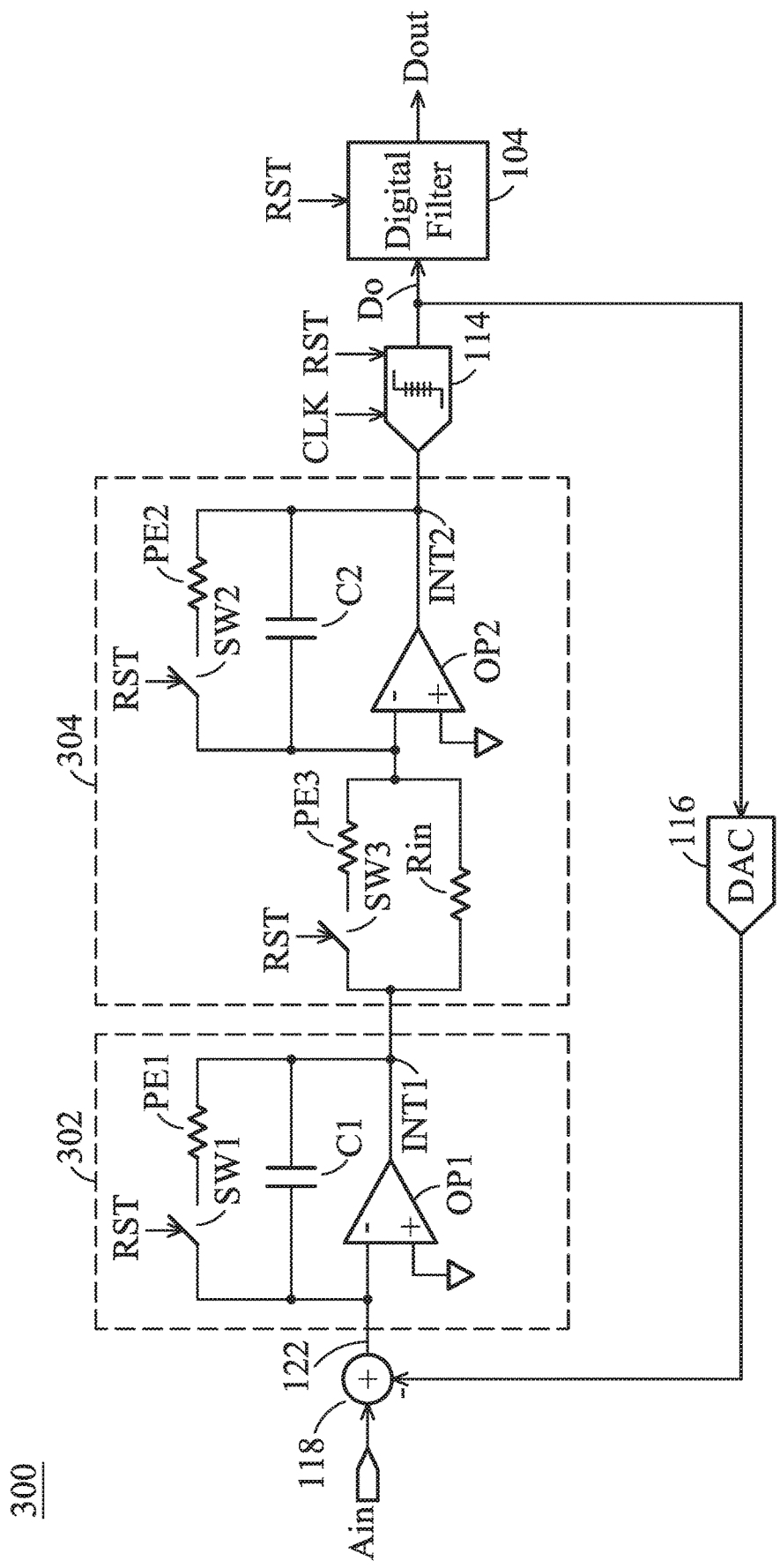
FIG. 3 depicts an incremental ADC 300 in accordance with an exemplary embodiment of the present invention, which is a continuous time ADC.

FIG. 3 depicts an incremental ADC 300 in accordance with an exemplary embodiment of the present invention, which is a continuous time ADC.

As shown in FIG. 3, the loop filter 112 of FIG. 1 may include a first stage circuit 302 and a second stage circuit 304 as shown in FIG. 3, wherein each stage circuit relates to an integral calculation. An integral output INT1 of the first stage circuit 302 and an integral output INT2 of the second stage circuit 304 are preset (rather than being cleaned to zero) during the reset phase of the incremental ADC 300.

In the first stage circuit 302, there is an operational amplifier op1, a feedback capacitor C1, a preset element PE1, and a switch SW1. The difference 122 is coupled to an input terminal '-' of the operational amplifier op1. The integral output INT1 is generated at an output terminal of the operational amplifier op1. The feedback capacitor C1 is coupled between the input terminal '-' and the output terminal of the operational amplifier op1. The preset element PE1 and the switch SW1 are connected in series between the input terminal '-' and the output terminal of the operational amplifier op1. During the reset phase of the incremental ADC 300, the switch SW1 is closed by the reset signal RST and thereby the preset element PE1 is connected in parallel with the feedback capacitor C1. The feedback capacitor C1 is not being completely cleaned, so that the integral output INT1 is preset rather than being cleaned to zero during the reset phase of the incremental ADC 300.

In the second stage circuit 304, there is an operational amplifier op2, a feedback capacitor C2, an input resistor Rin, a preset element PE2, and a switch SW2. The integral output INT1 from the first stage circuit 302 is coupled to an input terminal '-' of the operational amplifier op2 through the input resistor Rin. The integral output INT2 is generated at an output terminal of the operational amplifier op2. The feedback capacitor C2 is coupled between the input terminal '-' and the output terminal of the operational amplifier op2. The preset element PE2 and the switch SW2 are connected in series between the input terminal '-' and the output terminal of the operational amplifier op2. During the reset phase of the incremental ADC 300, the switch SW2 is closed by the reset signal RST and thereby the preset element PE2 is connected in parallel with the feedback capacitor C2. The feedback capacitor C2 is not being completely cleaned, so that the integral output INT2 is preset rather than being reset to zero during the reset phase of the incremental ADC 300.

In FIG. 3, the second stage circuit 304 further has a preset element PE3 and a switch SW3. The preset element PE3 and the switch SW3 are connected in series between the output terminal of the operational amplifier op1 and the input terminal '-' of the operational amplifier op2. During the reset phase of the incremental ADC 300, the switch SW3 is closed by the reset signal RST and thereby the preset element PE3 is connected in parallel with the input resistor Rin. The preset integral output INT1 is coupled to the second stage circuit 304 via the preset elements PE3 and the input resistor Rin which are connected in parallel. The preset element PE3 and a switch SW3 are optional.

In FIG. 3, the preset elements PE1, PE2 and PE3 are resistors but not limited thereto. The preset elements PE1, PE2 and PE3 may be buffers, or any active or passive components.

The switches SW1, SW2 and SW3 and the preset elements PE1, PE2 and PE3 form the preset circuit that presets the output terminal 124 of the loop filter 112 during the reset phase of the incremental ADC.

Figure 4:
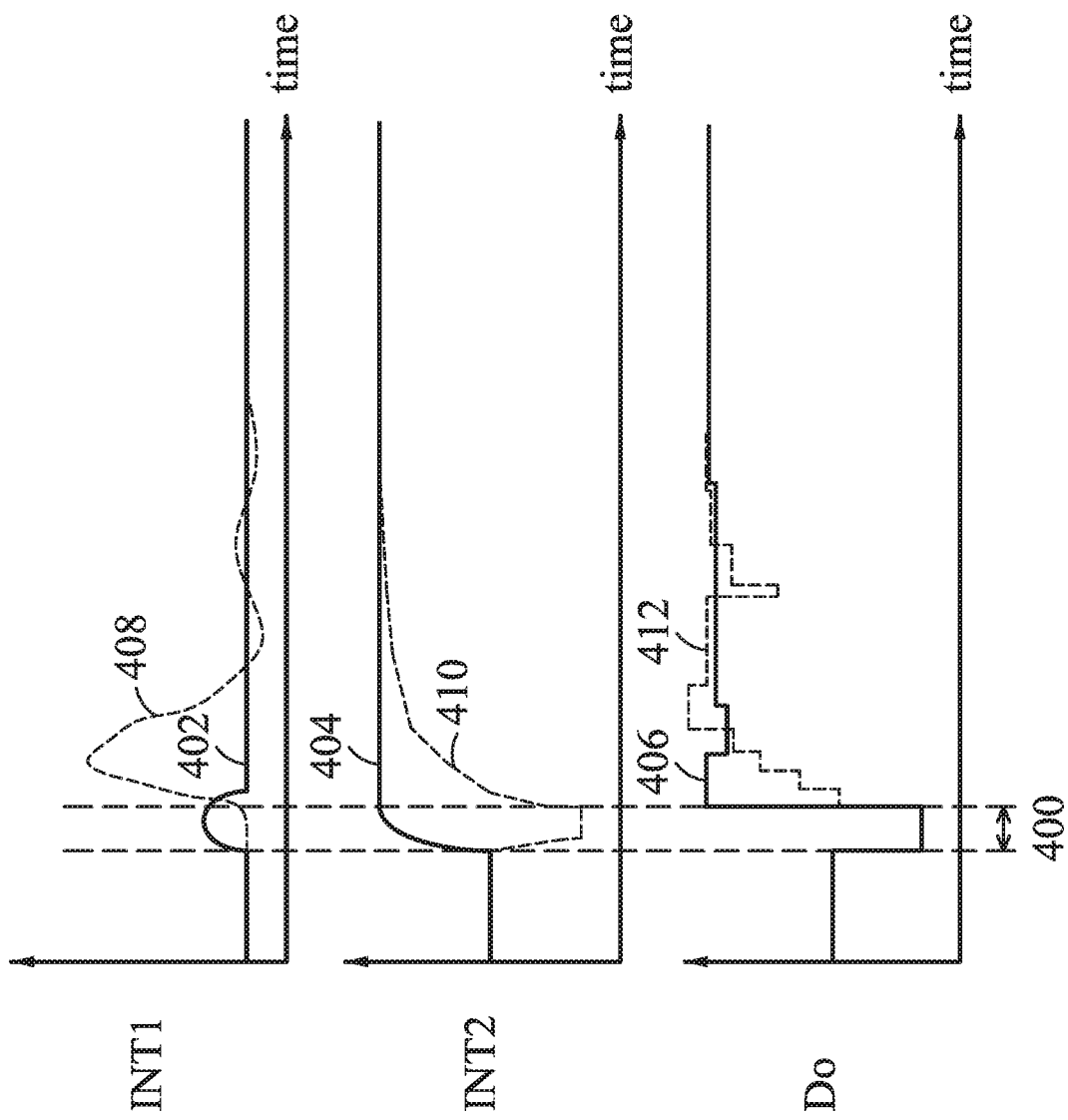
FIG. 4 shows the transient waveforms of the integral outputs INT1 and INT2 and the quantized signal Do.

FIG. 4 shows the transient waveforms of the integral outputs INT1 and INT2 and the quantized signal Do. The solid lines 402, 404 and 406 are the transient waveforms of the integral output INT1, the integral output INT2 and the quantized signal Do of the incremental ADC 100. The dotted lines 408, 410 and 412 are the transient waveforms of signals of a conventional incremental ADC in which an output terminal of a loop filter is also reset during the reset phase of ADC. Referring to the solid lines 402 and 404 in the present invention, the integral outputs INT1 and INT2 are preset (during the time interval 400, corresponding to the reset phase of ADC) rather than being reset and the shorter settling time (in comparison with the dotted lines 408 and 410) is shown. In comparison with the dotted line 412, the quantized signal Do shown by the solid line 406 is quickly raised to the desired value because of the preset integral outputs INT1 and INT2. The transient response of the incremental ADC is obviously improved in the present invention.

Figure 5:
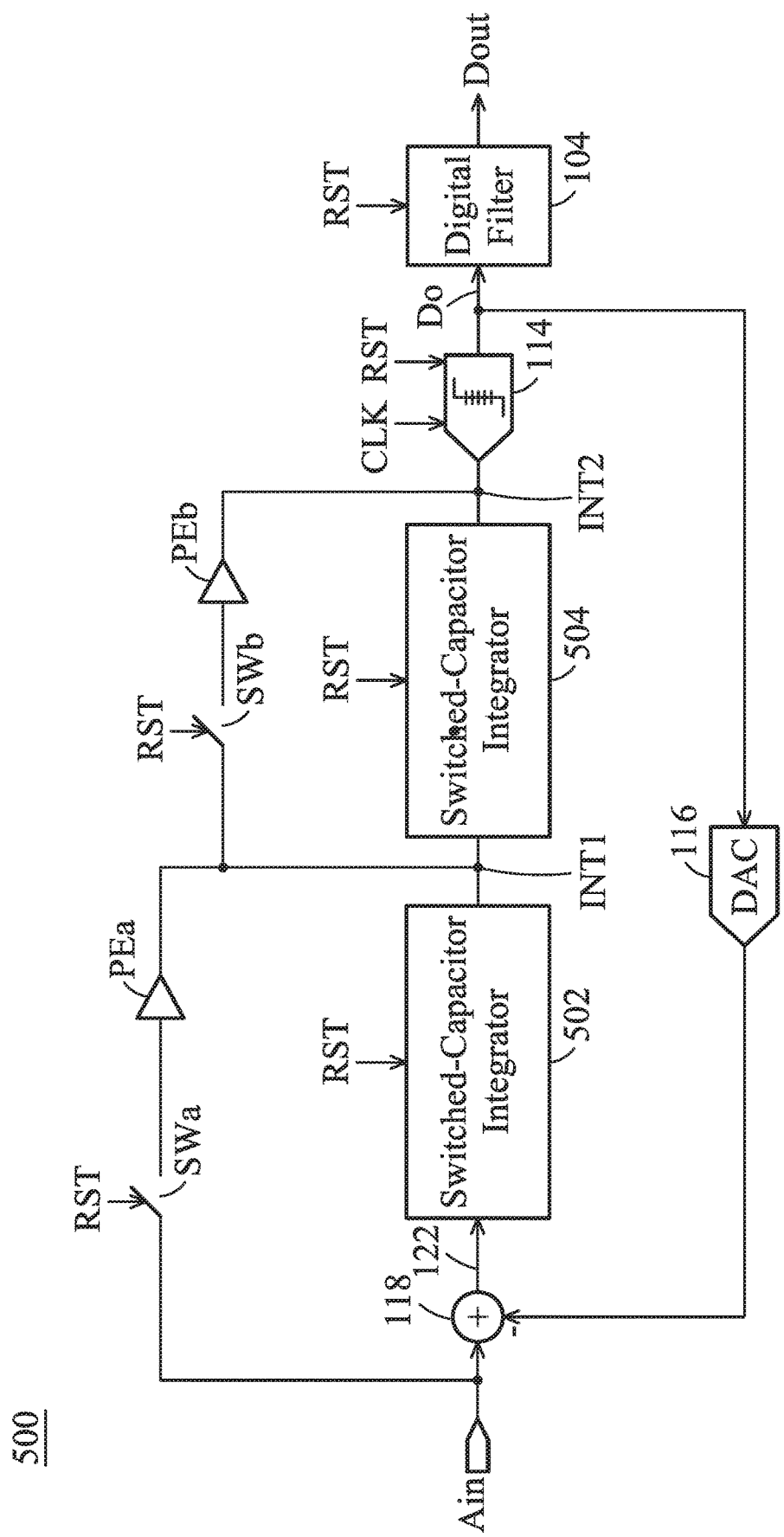
FIG. 5 depicts an incremental ADC 500 in accordance with an exemplary embodiment of the present invention, which is a discrete time ADC.

FIG. 5 depicts an incremental ADC 500 in accordance with an exemplary embodiment of the present invention, which is a discrete time ADC.

As shown in FIG. 5, the loop filter 112 of FIG. 1 may include two cascaded switched-capacitor integrators 502 and 504, a switch SWa, a preset element PEa, a switch SWb and a preset element PEb. The switch SWa and the preset element PEa are connected in series. The switch SWb and the preset element PEb are connected in series. The switched-capacitor integrator 502 outputs an integral output INTL The switched-capacitor integrator 504 outputs an integral output INT2. When the switches SWa and SWb are closed according to the reset signal RST of the incremental ADC 500, the analog input signal Ain is coupled to the integral output INT1 through the preset element PEa, and the integral output INT1 is coupled to the integral output INT2 through the preset element PEb. Thus, when entering the following analog-to-digital conversion cycle, the quantized signal Do is not zero, which effectively limit the difference 122. The switched-capacitor integrators 502 and 504, therefore, all operate within their linear region. The non-linear errors due to a dramatic variation of the difference 122 at the beginning of each analog-to-digital conversion cycle are reduced.

In the example shown in FIG. 5, the switched-capacitor integrators 502 and 504 are resettable. According to the reset signal RST, the capacitors within the switched-capacitor integrators 502 and 504 are cleaned. The preset status of the integral outputs INT1 and INT2 are achieved by the closed switches SWa and SWb and the preset elements PEa and PEb. The preset elements PEa and PEb may be resistors, buffers, or any active or passive components.

The switches SWa and SWb and the preset elements Pea and PEb form the preset circuit that presets the output terminal 124 of the loop filter 112 during the reset phase of the incremental ADC.

In another exemplary embodiment, the switched-capacitor integrators 502 and 504v may be replaced by RC integrators.

In FIG. 3 and FIG. 5, only two cascaded integrators are shown. However, the number of cascaded integrators within the loop filter 112 is not limited to two. Any circuit design presetting the output terminal 124 of the loop filter 112 during the reset phase of the whole ADC should be regarded within the scope of the present invention.

Based on the concept of FIG. 3, the loop filter 112 may comprise a plurality of analog integrators cascaded in a series, and the preset circuit of the loop filter 112 includes a plurality of preset elements (PE #) corresponding to the plurality of analog integrators one by one. Each preset element and a feedback capacitor of the corresponding analog integrator are connected in parallel during the reset phase of the incremental analog-to-digital converter.

Based on the concept of FIG. 5, the loop filter 112 may comprise a plurality of analog integrators cascaded in a series, and the preset circuit of the loop filter 112 couples the analog input signal to output terminals of the analog integrators during the reset phase of the incremental analog-to-digital converter.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An incremental analog-to-digital converter, comprising:
    a delta-sigma modulator, performing delta-sigma modulation on an analog input signal to output a quantized signal; and
    a digital filter, receiving the quantized signal to generate a digital representation of the analog input signal,
    wherein:
    the delta-sigma modulator includes a quantizer, a digital-to-analog converter, and a loop filter;
    the quantizer outputs the quantized signal;
    the digital-to-analog converter has an input terminal coupled to an output terminal of the quantizer, and generates an estimate of the quantized signal;
    the loop filter operates according to a difference between the analog input signal and the estimate, and an output terminal of the loop filter is coupled to an input terminal of the quantizer;

the loop filter has a preset circuit that presets the output terminal of the loop filter to a value dependent on the analog input signal during a reset phase of the incremental analog-to-digital converter, wherein the quantizer is reset during the reset phase; and the preset circuit couples the analog input signal to the output terminal of the loop filter during the reset phase.

2. The incremental analog-to-digital converter as claimed in claim 1, wherein:

the loop filter comprises a plurality of analog integrators cascaded in a series;

the preset circuit includes a plurality of preset elements corresponding to the plurality of analog integrators one by one; and each preset element and a feedback capacitor of the corresponding analog integrator are connected in parallel during the reset phase of the incremental analog-to-digital converter.

3. The incremental analog-to-digital converter as claimed in claim 1, wherein:

the loop filter comprises a first analog integrator;

the first analog integrator has a first operational amplifier and a first feedback capacitor coupled between an input terminal and an output terminal of the first operational amplifier;

the preset circuit comprises a first switch and a first preset element connected in series between the input terminal and the output terminal of the first operational amplifier; and the first switch is closed during the reset phase of the incremental analog-to-digital converter.

4. The incremental analog-to-digital converter as claimed in claim 3, wherein:

the loop filter further comprises a second analog integrator coupled between the first analog integrator and the quantizer;

the second analog integrator has a second operational amplifier and a second feedback capacitor coupled between an input terminal and an output terminal of the second operational amplifier;

the preset circuit further comprises a second switch and a second preset element connected in series between the input terminal and the output terminal of the second operational amplifier; and the second switch is closed during the reset phase of the incremental analog-to-digital converter.

5. The incremental analog-to-digital converter as claimed in claim 4, wherein:

the second analog integrator comprises an input resistor coupled between the output terminal of the first operational amplifier and the input terminal of the second operational amplifier;

the preset circuit further comprises a third switch and a third preset element connected in series between the output terminal of the first operational amplifier and the input terminal of the second operational amplifier; and the third switch is closed during the reset phase of the incremental analog-to-digital converter.

6. The incremental analog-to-digital converter as claimed in claim 5, wherein:

the first, second and third preset elements are resistors.

7. The incremental analog-to-digital converter as claimed in claim 1, wherein:

the loop filter comprises a plurality of analog integrators cascaded in a series;

the preset circuit couples the analog input signal to output terminals of the analog integrators during the reset phase of the incremental analog-to-digital converter.

8. The incremental analog-to-digital converter as claimed in claim 7, wherein:

the analog integrators are reset during the reset phase of the incremental analog-to-digital converter.

9. The incremental analog-to-digital converter as claimed in claim 7, wherein:

the analog integrators are switched-capacitor integrators.

10. The incremental analog-to-digital converter as claimed in claim 1, wherein:

the loop filter comprises a first analog integrator;

the preset circuit comprises a first switch and a first preset element connected in series;

the first switch is closed during the reset phase of the incremental analog-to-digital converter; and the analog input signal is coupled to an output terminal of the first analog integrator by the first preset element when the first switch is closed.

11. The incremental analog-to-digital converter as claimed in claim 10, wherein:

the loop filter further comprises a second analog integrator coupled between the first analog integrator and the quantizer;

the preset circuit comprises a second switch and a second preset element connected in series between the output terminal of the first analog integrator and an output terminal of the second analog integrator; and the second switch is closed during the reset phase of the incremental analog-to-digital converter.

12. The incremental analog-to-digital converter as claimed in claim 11, wherein:

the first and second analog integrators are reset during the reset phase of the incremental analog-to-digital converter.

13. The incremental analog-to-digital converter as claimed in claim 11, wherein:

the first and second analog integrators are switched-capacitor integrators.

14. The incremental analog-to-digital converter as claimed in claim 1, wherein:

the digital filter comprises a digital integrator that is reset during the reset phase of the incremental analog-to-digital converter.

15. The incremental analog-to-digital converter as claimed in claim 13, wherein:

when the first switch is closed, the analog input signal is directly connected to a first terminal of the first preset element and a second terminal of the first preset element is directly connected to the output terminal of the first analog integrator;

when the second switch is closed, the output terminal of the first analog integrator is directly connected to a first terminal of the second preset element and a second terminal of the second preset element is directly connected to the output terminal of the second analog integrator.

* * * * *